United States Patent
Kwon et al.

(10) Patent No.: US 9,567,555 B2
(45) Date of Patent: Feb. 14, 2017

(54) COATING APPARATUS AND METHOD OF FABRICATING LIQUID CRYSTAL DISPLAY DEVICE USING THE SAME

(75) Inventors: O-Jun Kwon, Gyeongsan (KR); Kang-Il Cho, Gyeonggi-Do (KR)

(73) Assignee: LG DISPLAY CO., LTD., Seoul (KR)

( * ) Notice: Subject to any disclaimer, the term of this patent is extended or adjusted under 35 U.S.C. 154(b) by 2289 days.

(21) Appl. No.: 11/426,306

(22) Filed: Jun. 24, 2006

(65) Prior Publication Data
US 2006/0292295 A1    Dec. 28, 2006

(30) Foreign Application Priority Data
Jun. 25, 2005 (KR) .................. 10-2005-0055386

(51) Int. Cl.
*B05D 5/06* (2006.01)
*C11D 11/00* (2006.01)
*B05C 5/02* (2006.01)
*G03F 7/16* (2006.01)

(52) U.S. Cl.
CPC .......... *C11D 11/0047* (2013.01); *B05C 5/0254* (2013.01); *G03F 7/16* (2013.01)

(58) Field of Classification Search
CPC .......... B05C 5/0254; B05D 5/06; B05D 5/12; B05D 7/00; B05B 13/02; C11D 11/0047; G03F 7/16
See application file for complete search history.

(56) References Cited

U.S. PATENT DOCUMENTS

| | | | |
|---|---|---|---|
| 6,080,249 A | 6/2000 | Honma et al. | |
| 6,423,144 B1 * | 7/2002 | Watanabe | B05C 5/002 118/410 |
| 6,761,125 B2 * | 7/2004 | Kitano et al. | 118/301 |
| 2001/0003967 A1 * | 6/2001 | Kitano et al. | 118/301 |
| 2004/0090591 A1 * | 5/2004 | Jung | 349/187 |
| 2005/0083478 A1 * | 4/2005 | Lee et al. | 349/156 |

FOREIGN PATENT DOCUMENTS

| | | |
|---|---|---|
| CN | 1195839 A | 10/1998 |
| CN | 1593787 A | 3/2005 |
| JP | 2000-117179 | 4/2000 |

(Continued)

OTHER PUBLICATIONS

Office Action issued in corresponding Chinese Patent Application No. 200610090058.5; issued Mar. 27, 2009

(Continued)

*Primary Examiner* — Michael Wieczorek
*Assistant Examiner* — Michael G Miller
(74) *Attorney, Agent, or Firm* — Brinks Gilson & Lione

(57) ABSTRACT

A coating apparatus and a method of fabricating a liquid crystal display device using the same is described where a uniform coating layer over an entire surface of a substrate is formed by placing auxiliary coating devices at front and rear ends of the coating apparatus and starting the coating operation from the auxiliary coating device. The coating apparatus includes: a table on which an object is located; a slit nozzle installed above the table and dispensing a coating solution on the surface of the object; an auxiliary coating device installed at least one end of the table; and a driving unit moving the slit nozzle in a predetermined direction.

20 Claims, 7 Drawing Sheets

(56) References Cited

FOREIGN PATENT DOCUMENTS

| JP | 2001-293417 | 10/2001 |
| JP | 2004-932 | 1/2004 |
| JP | 2004-25003 | 1/2004 |
| JP | 2004-146651 | 5/2004 |
| JP | 2004-275921 | 10/2004 |
| JP | 2005-34837 | 2/2005 |
| JP | 2005-131499 | 5/2005 |
| JP | 2005-131500 | 5/2005 |

OTHER PUBLICATIONS

Office Action issued in corresponding Japanese Patent Application No. 2006-168272; mailed Jul. 13, 2009.
Office Action issued in corresponding Chinese Patent Application No. 200610090058.5, mailed Mar. 7, 2011.

* cited by examiner

COATING APPARATUS AND METHOD OF FABRICATING LIQUID CRYSTAL DISPLAY DEVICE USING THE SAME

This application claims the benefit of priority to Korean patent application 55386/2005, filed on Jun. 25, 2005, which is incorporated herein by reference.

TECHNICAL FIELD

The present application relates to a coating apparatus for coating a coating solution, on the surface of an object, and a method of fabricating a liquid crystal display device using the same.

BACKGROUND

A process of fabricating a flat panel display device or a semiconductor device includes a plurality of thin film deposition processes, photolithography processes for exposing a selected region of the thin film, and processes of etching the selected region of the thin film. In particular, the photolithography process includes a coating process for forming a photosensitive film, which is formed of a photosensitive material, such as a photoresist, on a substrate or a wafer, and exposing and developing processes for patterning the photosensitive film by using a mask having a predetermined pattern. The coating process for forming a photosensitive film on the substrate or the wafer is a spray coating method, a roll coating method, a spin coating method, or the like.

The spray coating method and the roll coating method are not suitable for high accuracy in terms of uniformity of a coating layer and adjustment of layer thickness. The spin coating method is used to form a high-accuracy pattern.

A spin coater as shown in FIG. 1 includes a spin chuck 5 that is connected to a rotary shaft 6, a cover 7 that covers the spin chuck 5 from the outside and can be opened/closed, and a nozzle 4 that is located above the spin chuck 5 and moves inside the cover 7 when the cover 7 is opened.

An object 10 to be coated with a photosensitive film is located on the spin chuck 5. A drain valve (not shown) that drains a photosensitive solution, such as a photoresist, which drops downwards, is installed under the cover 7.

In order for the spin coater to form a coating layer on the object 10, the nozzle 4 moves downwards and jets a photosensitive solution onto the surface of the object 10 that is located on the spin chuck 5. After the photosensitive solution is jetted on the object 10, the cover 7 is tightly closed. A motor M rotates, and the rotary shaft 6 connected to the motor M also rotates, such that the spin chuck 5, on which the object 10 is located, spins at a predetermined rotation rate.

When the spin chuck 5 spins, the photosensitive solution jetted on the upper surface of the object 10 is spread outwards by centrifugal force, such that an entire surface of the object 10 is coated with the photosensitive solution.

When the entire surface of the object 10 is coated with the photosensitive solution, the photosensitive solution is hardened. The hardened photosensitive solution is exposed and developed by using a photo mask or the like, such that a predetermined pattern is formed on the surface of the object 10.

The spin coating method using the spin coater is suitable when a small object, such as a wafer, is coated with a photosensitive solution. When a large and heavy object, such as a substrate for a flat panel display device (e.g., a glass substrate for a liquid crystal display panel) is coated with a photosensitive solution, the spin coating method is not suitable.

The larger and heavier substrate to be coated with a photosensitive film is, the more difficult it is to rotate the substrate at a high speed. In addition, when the substrate is rotated at a high speed, it is much more likely to damage the substrate, and power consumption is also increased.

In addition, a substantial amount of the photosensitive solution is wasted as the amount of photosensitive solution used is much larger than the amount of photosensitive solution that is used for coating. That is, a considerable amount of photosensitive solution coated on the substrate surface scatters out of the spin chuck and wasted when the substrate is rotated at a high speed. In addition, the scatted photosensitive solution tends to act as foreign matter in a subsequent process for forming a thin film, and may contaminate an environment.

Semiconductor flat panel display device fabrication requires photolithography processes in order to pattern a thin film performing a specific function, for example, a metal thin film or a semiconductor thin film to form a predetermined shape. In the photolithography process, a photosensitive material, such as a photoresist that chemically reacts to light, is used.

Defects will be not generated during the process if a photosensitive film is formed to have a very uniform thickness on a substrate on which a thin film is formed. For example, when the photosensitive film is formed to have a greater thickness than a predetermined thickness, a desired portion of the thin film is not etched. In addition, when the photosensitive film is formed to have a smaller thickness than a predetermined thickness, the thin film is etched by a larger amount of etching than a desired amount of etching.

In particular, the uniform coating of the photosensitive solution is a very important factor since the size of the substrate increases in size as a liquid crystal display panel of a liquid crystal display device increases in size.

SUMMARY

A coating apparatus is described which includes: a table on which an object is located; a slit nozzle installed above the table and coating a coating solution on the surface of the object; an auxiliary coating device installed at least one end of the table; and a driving unit moving the slit nozzle in a predetermined direction.

A method of forming a coating layer is described, which includes: starting preliminary discharging of a coating solution through a nozzle at a first auxiliary coating device; discharging the coating solution while moving the nozzle toward a substrate; and discharging the coating solution up to an end point of the substrate.

A method of fabricating a liquid crystal display device includes: providing substrates; performing an array process or a color filter process on the substrate using a photolithography process that includes starting to discharge a coating solution through a nozzle at a first auxiliary coating device, discharging the coating solution while moving the nozzle toward the substrate, and discharging the coating solution up to an end point of the substrate; attaching the two substrates, on which the array process and the color filter process are performed, respectively, to each other; and, cutting the attached substrates into a plurality of unit liquid crystal display panels.

DETAILED DESCRIPTION

Examples of embodiments of the invention may be better understood with reference to the drawings. Like numbered elements in the same or different drawings perform equivalent functions.

Figure 1:
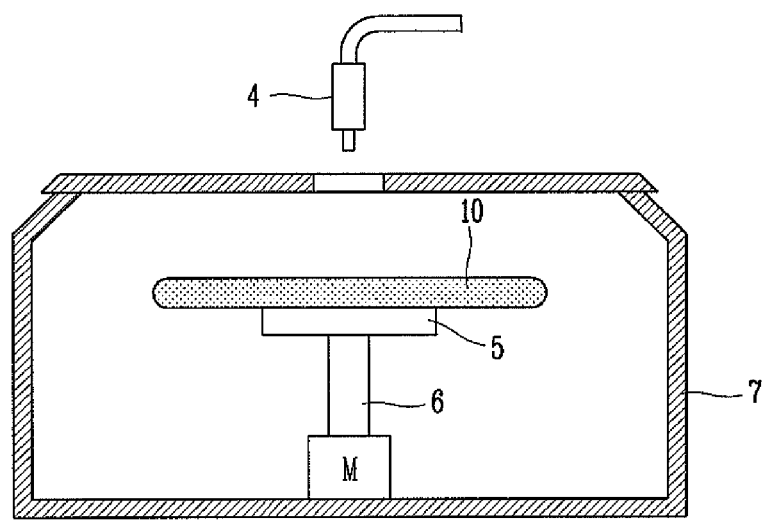
FIG. 1 is a cross-sectional view illustrating a construction of a related art spin coater.
Figure 2A:
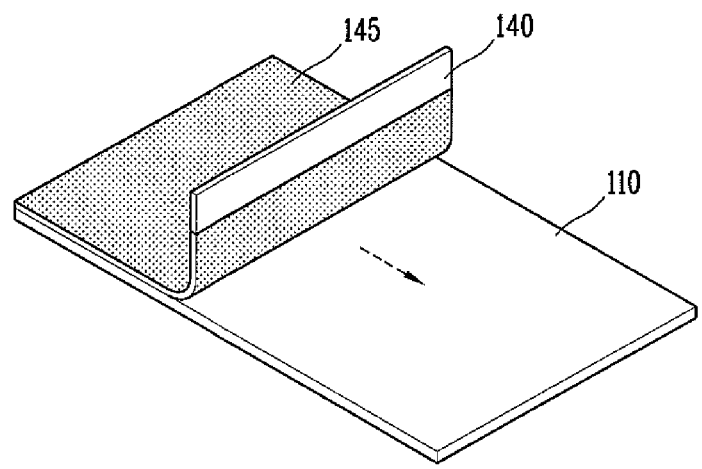
FIGS. 2A and 2B are perspective views illustrating the a slit coater principle.
Figure 2B:
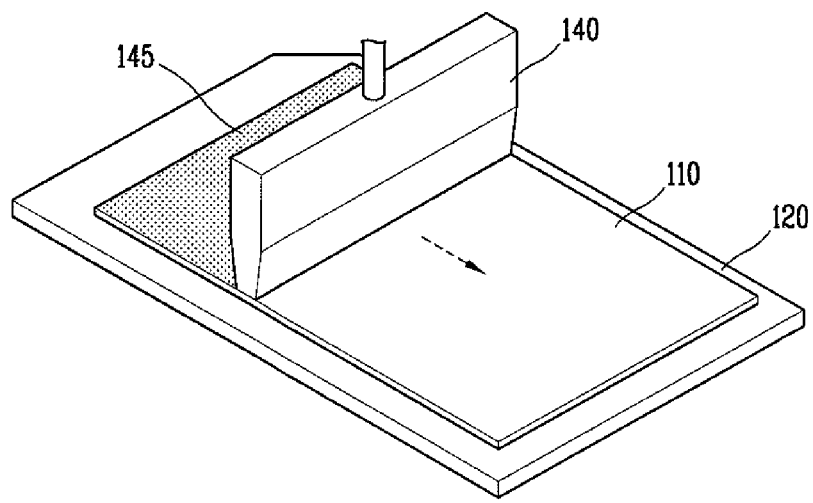

FIGS. 2A and 2B illustrate the concept of a slit coater. In an example, a slit coater has a nozzle 140 having a long and narrow slit shape and supplies a photosensitive solution 145 by using the slit nozzle 140, such that the slit coater coats the photosensitive solution 145 in a sheet form on the surface of a substrate 110.

That is, the slit coater is an apparatus for coating a predetermined amount of the photosensitive solution 145 on the substrate 110 by the long silt nozzle 140 having a bar shape. The slit coater forms a uniform photosensitive film on the surface of the substrate 110 by coating a predetermined amount of the photosensitive solution 145 through the nozzle 140 while the slit coater moves from one end to the other end of the substrate at a predetermined speed.

In addition, the slit coater has an advantage in that a photosensitive solution can be used without being wasted, as compared to the above-described spin coater, because it is possible to coat the photosensitive solution 145 on only desired substrate 110 surfaces. In addition, the slit coater is suitable for a large-sized substrate or a rectangular substrate because it is possible to coat a photosensitive solution in a long and narrow sheet form.

The substrate 110 may be located on a table 110, and an arrow indicates a direction in which the slit nozzle 140 moves. The photosensitive solution 145 is jetted from the nozzle 140 and coated in the arrow direction.

An apparatus using the nozzle method may be called a "spinless" coater because the spinner is not used, or a slit coater because the photosensitive solution is jetted through a slit. The slit coater supplies the photosensitive solution through a nozzle having a slit shape whose length is greater than the width thereof, such that the substrate surface is coated with the photosensitive solution in a sheet form. The slit coater may be suitable when a large-sized liquid crystal display panel is coated with the photosensitive solution.

A slit coater may accommodate a rectangular glass substrate, which may be used to fabricate a screen panel of a liquid crystal display device, as the object to be coated. A conductive film may be formed on the surface of the substrate, and the slit coater is used for coating a photosensitive solution on the surface of the substrate. In addition, the slit coater may be modified to be used as an apparatus for coating a photosensitive solution on various types of substrates for flat panel display devices as well as a glass substrate for a liquid crystal display device.

Figure 3:
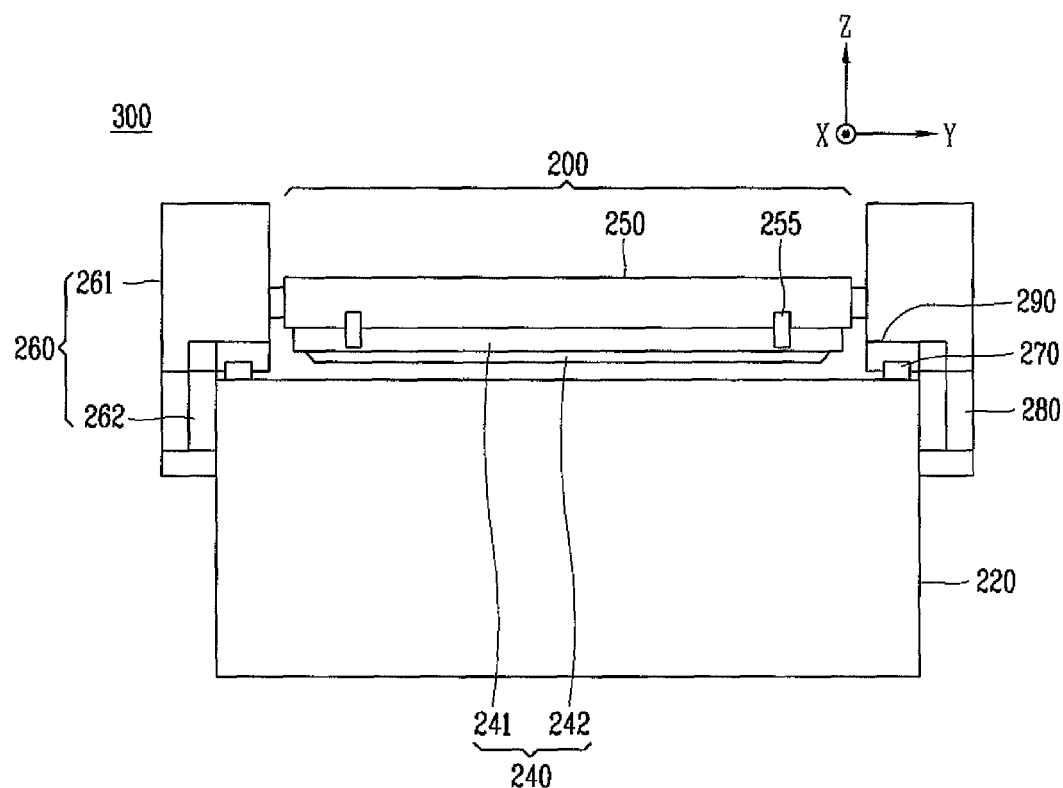
FIG. 3 is a front view schematically illustrating a slit coater.

A slit coater 300, shown in FIG. 3, includes a table 220 on which a substrate (not shown) is accommodated, a slit nozzle unit 200 for coating a coating solution, which may be a photosensitive solution like a photoresist, on the substrate, and a driving unit 260 installed at both ends of the slit nozzle unit 200 to move the slit nozzle unit 200 at a predetermined speed.

In addition, the slit coater 300 includes a supplying unit (not shown) for supplying a photosensitive solution to coated on the substrate, and a pumping unit (not shown) for applying a predetermined pressure while supplying the photosensitive solution to the slit nozzle unit 200 from the supplying unit such that the photosensitive solution is jetted.

Although not shown in the drawing, the supplying unit may include a storage tank for storing the photosensitive solution, supply piping for supplying the photosensitive solution stored in the storage tank, and a flow controlling device.

The storage tank stores a coating solution, such as a photosensitive solution like a photoresist, a developing solution, or a color filter material, which is supplied to the slit nozzle unit 200. The storage tank may be attached to the driving unit 260.

The pumping unit pressurizes the inside of the storage tank so as to supply the photosensitive solution, stored in the storage tank, to the slit nozzle unit 200, such that the photosensitive solution in the slit nozzle unit 200 is jetted by the pressure.

An object, such as a glass substrate, is located at an upper surface of the table 220. A plurality of pins that may be used to lift the substrate from the table 220 are installed on the table surface. The table 220 may be formed of a stone material having a square shape, and upper and side surfaces thereof are processed to be flat.

The upper surface of the table 220 corresponds to a horizontal plane, and the substrate to be coated may be placed thereon. A plurality of vacuum holes is formed on the upper surface of the table and the substrate is maintained at a predetermined horizontal position by adhesion of the substrate to the table 220 while the slit coater 300 processes the substrate.

Auxiliary coating devices may be installed at front and rear ends of the table 220. The coating solution starts to be coated at the front auxiliary coating device and finishes being coated at the rear auxiliary coating device. In this manner, it may be possible to form a uniform coating layer over an entire surface of the substrate. The auxiliary coating device may be installed at only the front end of the substrate, or the auxiliary coating devices may be installed at both front and rear ends of the substrate.

The driving unit 260 includes a pair of Z-axis driving devices 261 installed at both ends of the slit nozzle unit 200 for moving the slit nozzle unit 200 in a vertical direction (i.e., Z-axis direction); and, a pair of X-axis driving devices 262 moving the slit nozzle unit 200 in a horizontal direction (i.e., X-axis direction) at a predetermined speed so as to uniformly coat the photosensitive solution on the substrate surface.

The X-axis driving unit 262 may include a moving unit 270, such as a motor (not shown), a moving rail, and a guide rail. A non-contact type linear motor may used. The moving unit 270 guides movement of the slit nozzle unit 200, together with a support block 290 supported and installed at both sides of the table 220. That is, in order to coat the coating solution on the substrate through the slit nozzle unit 200, the moving unit 270 serves a guide so that the slit nozzle unit 200 moves in an X-axis direction so as to be horizontally disposed with respect to the surface of the table 220.

The slit nozzle unit 200 is installed to be substantially horizontal at both sides of the table 220. The slit nozzle unit 200 includes a nozzle 240 having a slit shape that has a length substantially corresponding to the width of the substrate, and a head 250 to which the nozzle 240 is mounted. In addition, the slit nozzle unit 200 may include a gap sensor 255 for measuring a gap between the nozzle 240 and the substrate to be coated.

Figure 4:
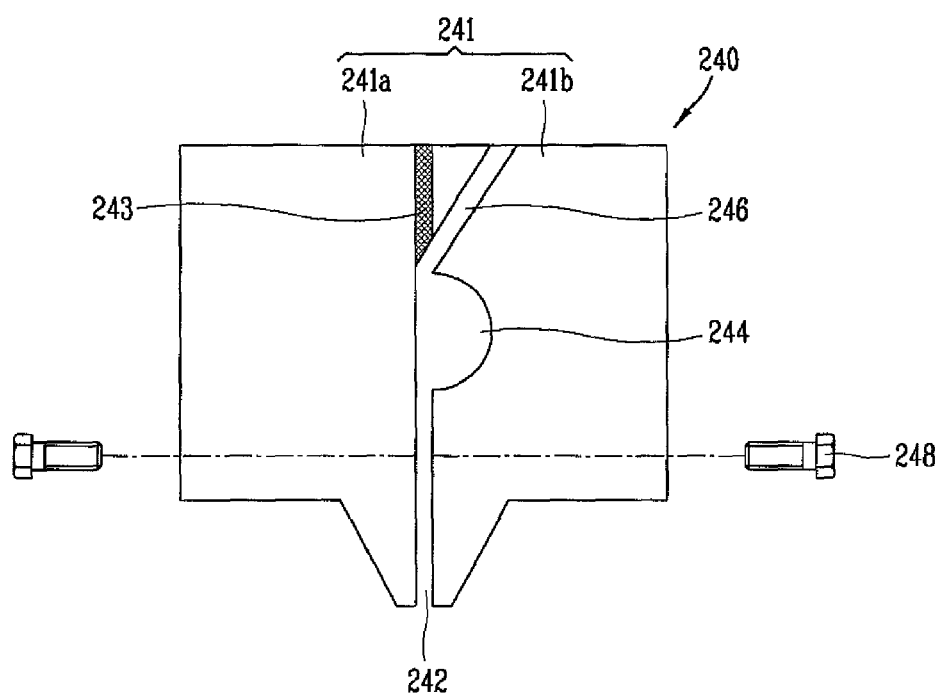
FIG. 4 is a view schematically illustrating a cross section of a slit nozzle shown in FIG. 3.

The nozzle 240, shown in detail in FIG. 4, includes a nozzle body 241, an inlet, and an outlet 242. The nozzle body 241 has a receiving space 244 for storing the photosensitive solution inside the nozzle body 241. The inlet is formed on the nozzle body 241, and the outlet 242 is formed on the surface of the nozzle body 241 that is disposable opposite to the substrate. The outlet 242 has a slit shape that has greater length that width.

The nozzle 240 uniformly coats the photosensitive solution on the substrate surface by jetting the photosensitive solution while the nozzle 240 is moved from one end of the substrate to the other end thereof by the X-axis driving unit 262. Alternatively, the same photosensitive solution coating process may be performed by sliding the substrate 100 while the nozzle 240 is fixed.

The nozzle 240 has a structure in which the nozzle body 241, that is, the first nozzle body 241a and the second nozzle body 241b, are coupled to each other. A receiving space 244 is formed between the first nozzle body 241a and the second nozzle body 241b so as to temporarily store a predetermined amount of the photosensitive solution, such that the photosensitive solution that is pressurized by the pumping unit is uniformly jetted.

An inlet 246 is formed at an upper portion of the second nozzle body 241b so as to supply the photosensitive solution to the receiving space 244. The outlet 242 has a slit shape that has greater length than width, and is formed on the surface opposite to the substrate, such that the substrate surface may be coated with the photosensitive solution in a sheet form.

In addition, a gap distance between the first nozzle body 241a and the second nozzle body 241b is determined and maintained by a thin shim 243 which may be made of stainless steel, or the like. The distance between the first nozzle body 241a and the second nozzle body 241b is adjusted by fastening or loosening a plurality of bolts 248 provided at a lower portion of the nozzle body 241.

FIGS. 5A to 5E are cross-sectional views sequentially illustrating a first example of a coating process.

The distance D1 between the nozzle 240 and a substrate 210 is set to about 35 μm, and a photosensitive solution starts to be discharged with the nozzle 240 stationary in the X direction in a coating start section in order that coating defects may be prevented at the start of coating and a uniform coating layer 245 formed.

In the coating start section, a coating solution starts to be coated by controlling various processing variables such that a coating defects do not occur during the coating operation and the uniformity is almost the same as a normal coating section. The distance D1 between the substrate 210 and the nozzle 240 is small for prevention of the coating defect at the start point of coating and layer uniformity. When a state where uniformity of a coating layer 245 has been achieved, the nozzle 240 rises vertically and moves in a horizontal direction. Here, the layer uniformity may be affected by horizontal acceleration, a moving speed, a coating solution discharging speed, synchronization of the moving unit, and the like.

Figure 5A:
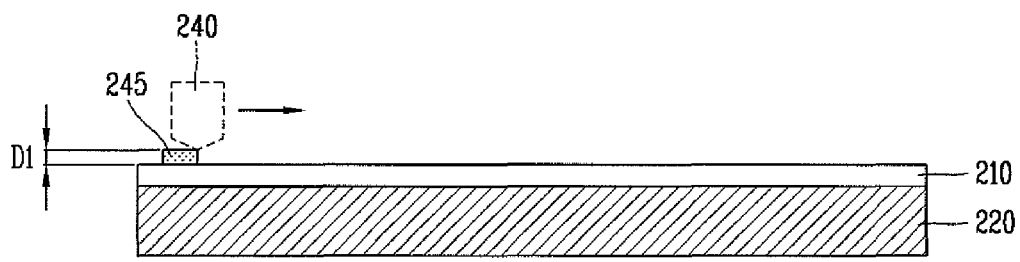
FIGS. 5A to 5E are cross-sectional views sequentially illustrating a first example of a coating process.
Figure 5B:
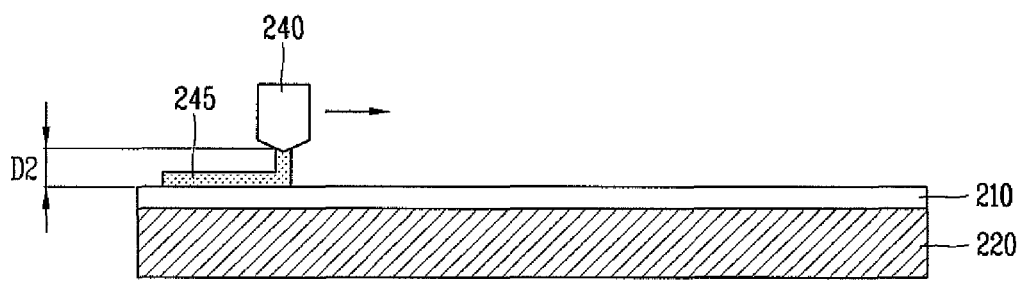

FIG. 5B shows a normal coating start section. If the coating start section is a section for which horizontal and vertical moving speeds vary, the normal coating section refers to a state where the horizontal moving speed is substantially constant and the vertical moving speed is substantially zero. Therefore, it is possible to obtain the uniform coating layer 245. A distance D2 between the nozzle 240 and the substrate 210 may be maintained at about 150 μm.

Figure 5C:
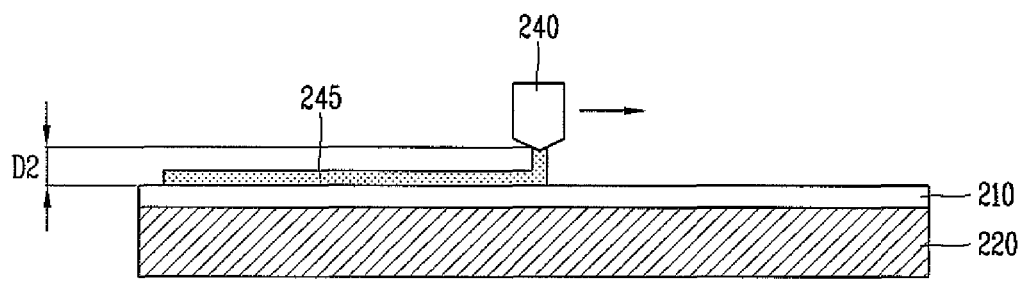
Figure 5D:
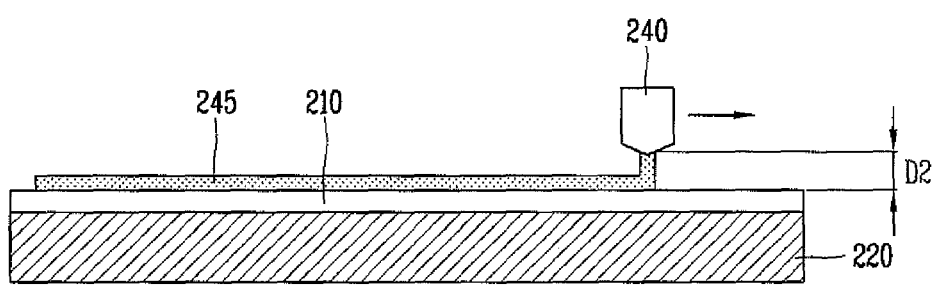

FIG. 5C shows a normal coating section and FIG. 5D shows a normal coating end section. The process for discharging the photosensitive solution is performed up to the end point of the substrate 210.

Figure 5E:
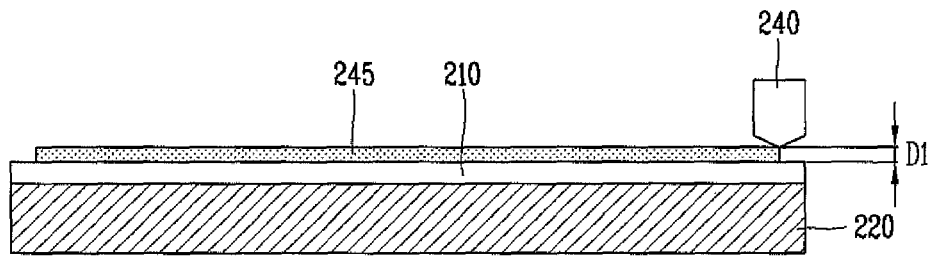

When the photosensitive solution is applied up to the end point of the substrate, as shown in FIG. 5E, operation of the pump (not shown) for discharging the photosensitive solution is stopped, and the distance D1 between the substrate 210 and the nozzle 240 becomes small in order to improve layer uniformity in a similar manner to the coating start section.

Although the operation of the pump for discharging the photosensitive solution may be stopped, the photosensitive solution may be discharged onto substrate 210 for a certain distance. If the D1 between the nozzle 240 and the substrate 210 is large, the coating layer 245 will be thick and coating defects may be generated.

In another aspect, auxiliary coating devices are installed at front and rear ends of a table, and coating is started and finished at the auxiliary coating devices, such that coating uniformity can be improved at the coating start and end points. Since manipulation of processing conditions may be simplified, it may be possible for a user to easily control the processing conditions. By reducing sensitivity of coating conditions to a nozzle state, the processing conditions are not substantially affected by a small change in the nozzle state.

FIGS. 6A to 6E are cross-sectional views sequentially illustrating a coating process in accordance with a second example, in which a coating solution coating process is illustrated where an auxiliary coating device is used.

Figure 6A:
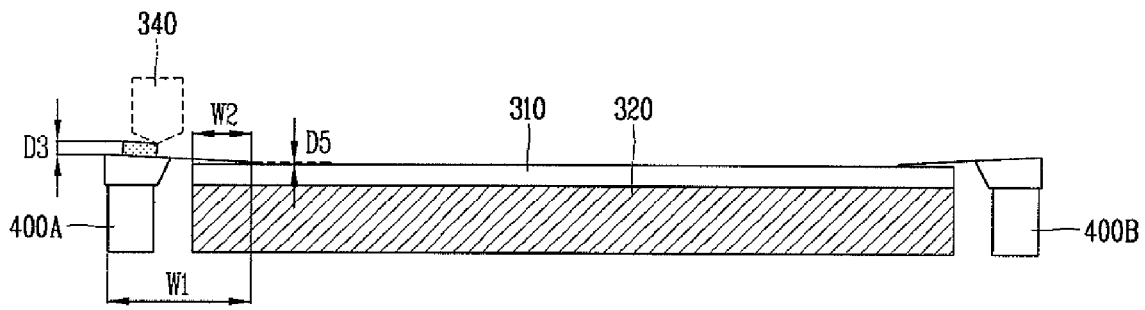
FIGS. 6A to 6E are cross-sectional views sequentially illustrating a second example of a coating process.

As shown in FIG. 6A, in a coating start section, a first auxiliary coating device 400A is installed at a front end of a substrate 310, a coating operation starts from the first auxiliary coating device 400A. A slit nozzle 340 discharges a photosensitive solution so as to form a uniform coating layer at the first auxiliary coating device 400A, and the slit nozzle 340 moves toward the substrate 310 in direction shown by the arrow in FIG. 6B at a predetermined speed.

Figure 6B:
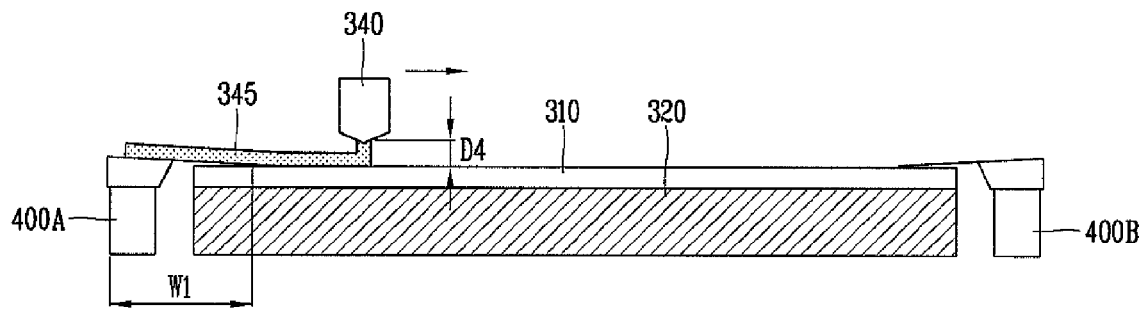

An upper end portion of the first auxiliary coating device 400A may be placed so as to overlap the substrate 310. A width W1 of the auxiliary coating device 400A is about 10 mm such that uniformity of the coating layer may be formed. When the slit nozzle 340 reaches the substrate 310, as shown in FIG. 6B, the slit nozzle 340 discharges the coating solution on the substrate 310 surface while a coating solution discharging velocity and a nozzle 340 moving speed are maintained substantially constant and a distance D4 between the nozzle 340 and the substrate 310 is maintained substantially constant.

The first auxiliary coating device 400A disposed at the front end of the substrate 310, where the coating solution starts to be coated, may be configured such that an upper end portion thereof has an inclined angle relative to the substrate 310.

When the slit nozzle 340 is positioned at the first auxiliary coating device 400A first, the slit nozzle 340 has a distance D3 of about 20 to 150 μm with respect to the upper end portion of the first auxiliary coating device 400A. When the nozzle 340 reaches the substrate 310 by an inclined surface of the upper end portion of the first auxiliary coating device 400A, a distance D4 set by the user is formed. The nozzle 340 may not be moved in a vertical direction and the D4 set by the user may be equal to or greater than the D3 between the substrate 310 and the nozzle 340 in the first auxiliary coating device 400A.

Where the preliminary discharging operation is performed by the first auxiliary coating device at the front end of the substrate 310 and sufficient coating solution to perform a discharging operation is discharged, when the nozzle 340 moves toward, and reaches, the substrate 310; the coating solution is discharged while a moving speed and a coating solution discharging speed are substantially constant, and the distance D4 between the nozzle 340 and the substrate 310 is substantially constant.

Figure 6C:
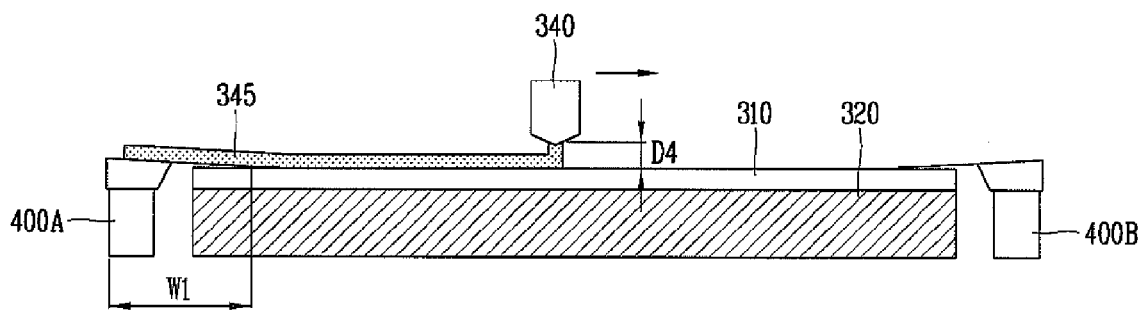
Figure 6D:
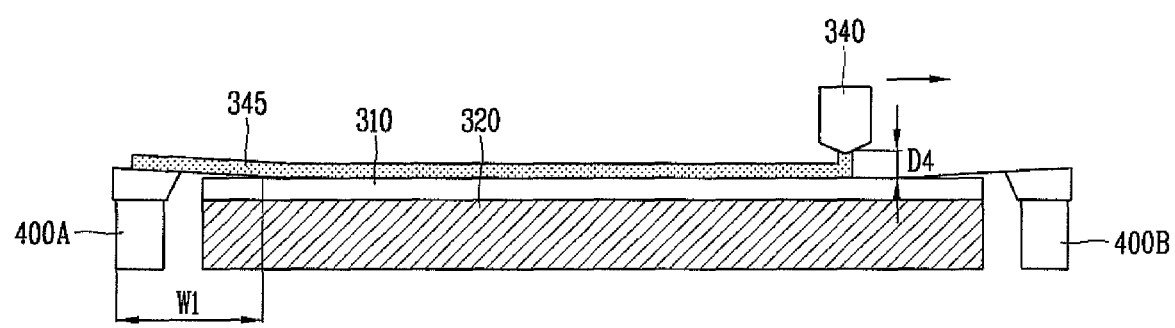

FIG. 6C shows a normal coating section and FIG. 6D shows a normal coating end section. In the same state as in FIG. 6B, the coating solution is discharged up to the end point of the substrate 310. When a horizontal moving speed is substantially constant and a coating solution is substantially uniformly discharged, it is possible to obtain a uniform coating layer 345 over an entire surface of the substrate 310. The distance D4 between the nozzle and the substrate 30 may be maintained at about, for example, 150 μm.

Figure 6E:
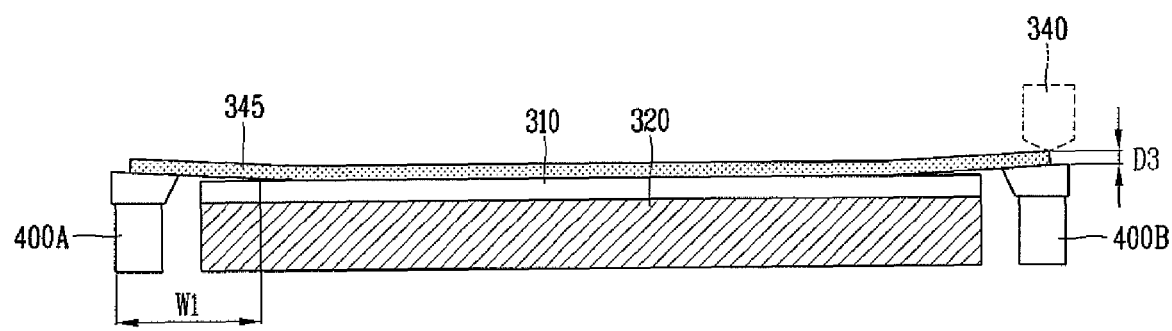

Even though the nozzle 340 finishes the coating operation at the end point of the substrate 310, as shown in FIG. 6E, the coating solution continues to be discharged until the nozzle 340 reaches a second auxiliary coating device 400B located at the rear end of the substrate 310.

In this example, the second auxiliary coating device 400B is installed at the rear end of the substrate 310. In another aspect, the auxiliary coating device may not be installed at the rear end of the substrate 310, because it is easier to control uniformity of the coating layer 345 at the end point of the substrate 310 when compared to the start point thereof.

When the second auxiliary coating device 400B is installed at the end of the substrate 310, it is possible to use the second auxiliary coating device 400B similarly to the auxiliary coating device of the front end of the substrate 310. In particular, when the nozzle 340 moves across the substrate 310 at a predetermined speed with a predetermined distance maintained between the nozzle 340 and the substrate 310, and a coating solution discharging operation is stopped at the rear end of the substrate 310, it is possible to improve uniformity of the coating layer 345 at the end point of the substrate 310 and simplify processing conditions. That is, the coating solution discharging operation is stopped at the second auxiliary coating device 400B of the rear end, and not at the substrate 310.

The auxiliary coating devices 400A and 400B have upper end portions, each of which extends toward an upper portion of the substrate 310, such that each end portion overlaps with the substrate 310 by a width W2 of about 0.1 to 5 mm. In order to prevent contamination of the end of the substrate 310 by the coating solution, each end portion covers the substrate 310 while a distance D5, perpendicular to the substrate 310, is maintained to be about 0 to 1000 μm. By doing this, contamination of the substrate 310 that results from the coating solution applied to the end of the substrate 310 can be prevented.

The auxiliary coating devices 400A and 400B, on which the coating layer is formed, are cleaned before a subsequent coating solution discharging operation is performed on a next substrate 310. In order to avoid contamination of the table 320 during the cleaning operation, the auxiliary coating devices 400A and 400B may horizontally move or rotate to a cleaning position. The cleaning operation may then be performed by various methods, such as a brush, ultrasonic, a roller, and the like.

The auxiliary coating devices 400A and 400B may additionally include a device may rotate or perform linear movement or be covered in order to prevent contamination of the table 320. The auxiliary coating devices 400A and 400B may be dried after cleaning.

A method of fabricating a liquid crystal display device includes an array process for forming an array substrate, a color filter process for forming a color filter substrate, and a cell process for attaching the array substrate and the color filter substrate to each other so as to form unit liquid crystal display panels.

In the array process, a plurality of gate lines and data lines are horizontal and vertically arranged on a transparent insulating substrate, such as glass, and define a plurality of pixel regions. A thin film transistor, which is a switching device connected to the gate and data lines, is formed on each of the pixel regions. In addition, a pixel electrode is connected to the thin film transistor for driving a liquid crystal layer according to a signal applied through the thin film transistor. In a case of an in-plane switching (IPS) mode, for example, a pixel region for forming a horizontal electric field at the liquid crystal layer, and a common electrode are formed at the same time.

In addition, in the color filter process, a color filter including sub color filters displaying red, green, and blue colors, and a black matrix that separates the sub color filters from each other and transmits the liquid crystal layer are formed on the color filter substrate. The black matrix may use an organic layer formed of a resin. For example, a colored organic resin, such as acryl containing any one of carbon black and black pigment, epoxy, or a polyimide resin may be used.

Thereafter, an overcoat layer formed of a transparent insulating material is formed on an entire surface of the substrate. The overcoat layer may be of a transparent resin that has an insulating characteristic in order to planarize the substrate on which the color filter is formed, and may prevent elution of pigment ions. The overcoat layer may be formed, for example, of an acryl resin or an epoxy resin.

The array process and the color filter process require a plurality of photolithography processes when patterns, such as the thin film transistor and the color filter, are formed.

The photolithography process refers to a series of processes, in which a desired pattern is formed by transferring a mask pattern to a substrate on which a thin film is deposited. The photolithography process includes a plurality of processes, such as a photosensitive solution coating process, an exposure process, a development process, and the like.

The above-described coating apparatus and the method of forming a coating layer are used in the photosensitive solution coating process. By installing auxiliary coating devices at front and rear ends of a table, an operation of coating the photosensitive solution starts at the auxiliary coating device and may finish at the auxiliary coating device. As a result, it may possible to improve coating uniformity at a coating start point and a coating end point of the substrate, and it may possible for the user to better control processing conditions by simplifying manipulation of the processing conditions. In addition, by reducing sensitivity to coating conditions, the processing conditions are not substantially affected even though the nozzle state changes a little.

A spacer formed of an organic layer may be formed on the color filter substrate and the array substrate. As a liquid crystal display panel increases in size, a column spacer (or patterned spacer) that is fixed to the array substrate or the color filter substrate is used as the above-described spacer.

After an alignment layer is applied on each of the array substrate and the color filter substrate, the alignment layer is aligned so as to provide an alignment controlling force or a surface anchoring force (i.e., so as to set a pre-tilt angle and orientation direction) to liquid crystal molecules of a liquid crystal layer formed between the two substrates. A rubbing method or a light-aligning method may be used.

A predetermined seal pattern is formed by a sealant on the color filter substrate, and at the same time, a liquid crystal layer is formed on the array substrate. A pressure is applied to the array substrate and the color filter substrate so as to join the two substrates to each other, such that unit liquid crystal display panels are formed.

Although only a few examples of this invention have been described in detail above, those skilled in the art will readily appreciate that many modifications are possible without materially departing from the novel teachings and advantages of the invention. Accordingly, all such examples and modifications are intended to be included within the scope of this invention as defined in the following claims.

What is claimed is:

1. A method of forming a coating layer, comprising:
    providing a first auxiliary coating device having an upper end portion, a substrate defining a predetermined area to be coated;
    preliminary discharging of a coating solution through a slit opening of a nozzle at the first auxiliary coating device;
    discharging the coating solution through the slit opening of the nozzle while moving the nozzle along a coating direction toward the substrate, the slit opening having a length extending along a direction perpendicular to the coating direction such that the coating solution is coated on an entire area of the predetermined area of the substrate in a sheet form and in one pass,
    wherein the upper end portion of the first auxiliary coating device extends toward an upper surface of the substrate and contacts the upper surface of the substrate, and
    wherein the upper end portion of the first auxiliary coating device has an upper surface inclined toward a center of the substrate such that the coating solution is continuously discharged from the upper surface of the first auxiliary coating device toward the upper surface of the substrate; and
    discharging the coating solution up to an end point of the substrate.

2. The method of forming a coating layer, according to claim 1,
    wherein a coating solution comprising one of a photoresist, a developing solution, or a color filter material is discharged through the nozzle.

3. The method of forming a coating layer, according to claim 1, further comprising:
    a second auxiliary coating device located at a rear end of the substrate, at which a coating process of the coating solution is completed.

4. The method of forming a coating layer, according to claim 3,
    wherein the nozzle discharges the coating solution at start and end points of a coating process while a first distance between the nozzle and the first and second auxiliary coating devices is about 20 to about 150 μm.

5. The method of forming a coating layer, according to claim 4,
    wherein the nozzle discharges the coating solution onto the substrate at the first auxiliary coating device or the second auxiliary coating device while the first distances are maintained between the nozzle and the substrate.

6. The method of forming a coating layer, according to claim 3, further comprising:
    cleaning the first and second auxiliary coating devices after the coating process is completed.

7. The method of forming a coating layer, according to claim 6, further comprising:
    drying the first and second auxiliary coating devices after the first and second auxiliary coating devices are cleaned.

8. The method of forming a coating layer, according to claim 6, further comprising:
    horizontally or rotatably moving the first and second auxiliary coating devices when the first and second auxiliary coating devices are cleaned.

9. The method of forming a coating layer, according to claim 1,
    wherein the nozzle discharges the coating solution while moving from the first auxiliary coating device toward the substrate at the start of a coating process.

10. The method of forming a coating layer, according to claim 1,
    wherein a distance between the nozzle and the substrate is adjusted to a second distance when the nozzle moves from the first auxiliary coating device to the substrate.

11. The method of forming a coating layer, according to claim 1, wherein a vertical location of the nozzle is substantially constant.

12. The method according to claim 1, wherein a coating layer is formed on the upper surface of the first auxiliary device and the upper surface of the respective first and second substrates and the coating layer includes a portion that connects the respective first and second substrates to the first auxiliary device.

13. The method according to claim 12, wherein the portion of the coating layer that connects the respective first and second substrates to the first auxiliary device is inclined.

14. A method of fabricating a liquid crystal display device, comprising:
    providing a first substrate and a second substrate, respectively, the first substrate and the second substrate each defining a predetermined area to be coated;
    providing a first auxiliary coating device having an upper end portion adjacent to a front end of the first and second substrates, respectively;
    performing an array process on the first substrate, and a color filter process on the second substrate respectively, each according to a respective photolithography process that includes preliminary discharging of a coating solution through a slit opening of a nozzle at the first auxiliary coating device, discharging the coating solution through the slit opening of the nozzle while moving the nozzle along a coating direction toward the respective first and second substrates, the slit opening having a length extending along a direction perpendicular to the coating direction such that the coating solution is coated on an entire area of the predetermined area of the respective first and second substrates in a sheet form and in one pass, wherein the upper end portion of the first auxiliary coating device extends toward an upper surface of the respective first and second substrates and contacts the upper surface of the respective first and second substrates, and the upper end portion of the first auxiliary coating device has an upper surface inclined toward a center of the respective first and second substrates, and continuously discharging the coating solution from the upper surface of the upper end portion of the first auxiliary coating device toward the upper surface of the respective first and second substrates up to an end point of the respective first and second substrates;

attaching the respective first and second substrates into an attached substrate; and cutting the attached substrate into a plurality of unit liquid crystal display panels.

15. The method of fabricating a liquid crystal display device according to claim 14, wherein a coating solution comprising one of a photoresist, a developing solution, or a color filter is discharged through the nozzle.

16. The method of fabricating a liquid crystal display device according to claim 14, further comprising:

a second auxiliary coating device located at a rear end of the respective first and second substrates, at which a coating process of the coating solution is completed.

17. The method of fabricating a liquid crystal display device according to claim 16:

wherein the nozzle discharges the coating solution at start and end points of a coating process while a first distance between the nozzle and the first and second auxiliary coating devices is maintained to be in a range of about 20 to about 150 μm.

18. The method of fabricating a liquid crystal display device according to claim 17, wherein the nozzle allows discharging of the coating solution to the respective first and second substrates at the first distances, or a second distance between the nozzle and the respective first and second substrates.

19. The method of fabricating a liquid crystal display device according to claim 14:

wherein the nozzle discharges the coating solution while moving from the first auxiliary coating device to the respective first and second substrates at the start of a coating operation.

20. The method of fabricating a liquid crystal display device according to claim 14:

wherein a distance between the nozzle and the respective first and second substrates is adjusted to a dispensing distance when the nozzle moves from the first auxiliary coating device to the respective first and second substrates.

* * * * *